(12) United States Patent
Jang

(10) Patent No.: US 12,305,382 B2
(45) Date of Patent: May 20, 2025

(54) PREFABRICATED MODULAR UNIT ASSEMBLY

(71) Applicant: Seok Kyu Jang, Seoul (KR)

(72) Inventor: Seok Kyu Jang, Seoul (KR)

( * ) Notice: Subject to any disclaimer, the term of this patent is extended or adjusted under 35 U.S.C. 154(b) by 0 days.

(21) Appl. No.: 18/701,919

(22) PCT Filed: Nov. 18, 2021

(86) PCT No.: PCT/KR2021/017036
§ 371 (c)(1),
(2) Date: Apr. 16, 2024

(87) PCT Pub. No.: WO2023/068435
PCT Pub. Date: Apr. 27, 2023

(65) Prior Publication Data
US 2024/0410158 A1    Dec. 12, 2024

(30) Foreign Application Priority Data

Oct. 18, 2021    (KR) .................. 10-2021-0138249

(51) Int. Cl.
*E04B 1/343* (2006.01)
*H05K 7/02* (2006.01)

(52) U.S. Cl.
CPC ......... *E04B 1/34317* (2023.08); *H05K 7/023* (2013.01)

(58) Field of Classification Search
CPC .. H04L 12/282; H04L 12/2827; E04F 13/074; E04F 13/0801; G01H 1/00; G01J 1/4204; G01N 15/02; G01N 33/0036; G01W 1/02; G09F 9/30; H04W 4/029; E04B 1/34331; E04B 1/34336; E04B 1/3511; G06Q 50/08

See application file for complete search history.

(56) References Cited

U.S. PATENT DOCUMENTS

2020/0225903 A1\* 7/2020 Cohen ................. G09G 5/12
2021/0172164 A1 6/2021 Holm et al.

FOREIGN PATENT DOCUMENTS

| KR | 10-1034957 B1 | 5/2011 |
| KR | 10-2014-0022351 A | 2/2014 |
| KR | 10-2016-0080519 A | 7/2016 |
| KR | 10-2251283 B1 | 5/2021 |

OTHER PUBLICATIONS

International Search Report for PCT/KR2021/017036 mailed Jun. 30, 2022 from Korean Intellectual Property Office.

\* cited by examiner

*Primary Examiner* — Allen L Parker
*Assistant Examiner* — Keon Kim
(74) *Attorney, Agent, or Firm* — Revolution IP, PLLC

(57) ABSTRACT

The present invention relates to a structure in which modular units completed by using a plurality of frames are assembled, and provides a prefabricated modular unit assembly including: a first modular unit including a main communication control means, which transmits/receives data through wired/wireless communication between the modular units so that same can be controlled; and a second modular unit including an auxiliary communication control means for transmitting/receiving to/from a main communication control means of the first modular unit.

3 Claims, 11 Drawing Sheets

PREFABRICATED MODULAR UNIT ASSEMBLY

TECHNICAL FIELD

The present invention relates to a prefabricated modular unit assembly having a communication function.

BACKGROUND ART

Generally, modular buildings refer to buildings that are completed by assembling modular units on a factory, previously constructing various interior and exterior materials, equipment, and wiring lines, then transporting the modular units to a site, and assembling and stacking the modular units, which is unlike the existing wet construction method of constructing a building on the site.

Such a modular unit may include waterproofing, finishing, and drainage equipment as well as electrical equipment and interior finishes and form a single unit space.

These modular units are usually manufactured in a hexahedral shape in a factory, are transported to a construction site through a transportation means, and are then moved and assembled by a work crane at the site. When the modular units are assembled, not only are the plurality of modular units fastened in a horizontal direction, but the plurality of modular units are stacked and fastened in a vertical direction.

Generally, the fastening between the modular units is achieved by fastening bolts, and in a high-rise building in which the plurality of modular units are stacked, a worker comes downward on a rope to tighten the bolts or fastens the modular units through bolts from the outside of the building using a high-place work vehicle.

However, the general modular units are only simply physically connected, and it is difficult to organically connect and control information communication, electricity, communication, plumbing, or the like between the units as well as to identify information on building materials. Therefore, it is not easy to repair defects and replace and upgrade components.

DISCLOSURE

Technical Problem

The present invention is directed to providing a prefabricated modular unit assembly in which a structure capable of performing mutual data communication between prefabricated modular units is applied, the modular units are monitored in real time, and thus maintenance such as repair or replacement of components may be easily performed.

Technical Solution

One aspect of the present invention provides a prefabricated modular unit assembly
  that is a structure in which a plurality of modular units completed using a plurality of frames are assembled,
  the prefabricated modular unit assembly including a first modular unit including a main communication control means that is controlled by transmitting and receiving data through mutual wired/wireless communication between the modular units, and
  a second modular unit including an auxiliary communication control means that transmits and receives data to and from the main communication control means of the first modular unit.

The main communication control means or the auxiliary communication control means may include a controller,
  a terminal member which is disposed on one side of the modular unit and in which a plurality of slots are formed at predetermined intervals, and
  a plurality of panels mounted on the slots of the terminal member,
  wherein the controller may has a function of controlling at least one of communication, electricity, heating/cooling, or water supply provided from the panels.

The main communication control means or the auxiliary communication control means may be equipped with a central processing unit (CPU) and process information transmitted to and received from the auxiliary communication control means or the main communication control means.

A display unit that is externally visible may be formed in the main communication control means or the auxiliary communication control means.

A short-range wireless communication unit for mutual wireless communication may be formed on a frame of a modular unit adjacent to and facing a frame of the modular unit.

Advantageous Effects

In a prefabricated modular assembly according to the present invention, a structure capable of performing mutual data communication between prefabricated modular units manufactured for construction is applied, the modular units are monitored in real time, and thus maintenance such as repair or replacement of components may be easily performed.

MODES OF THE INVENTION

Figure 1:
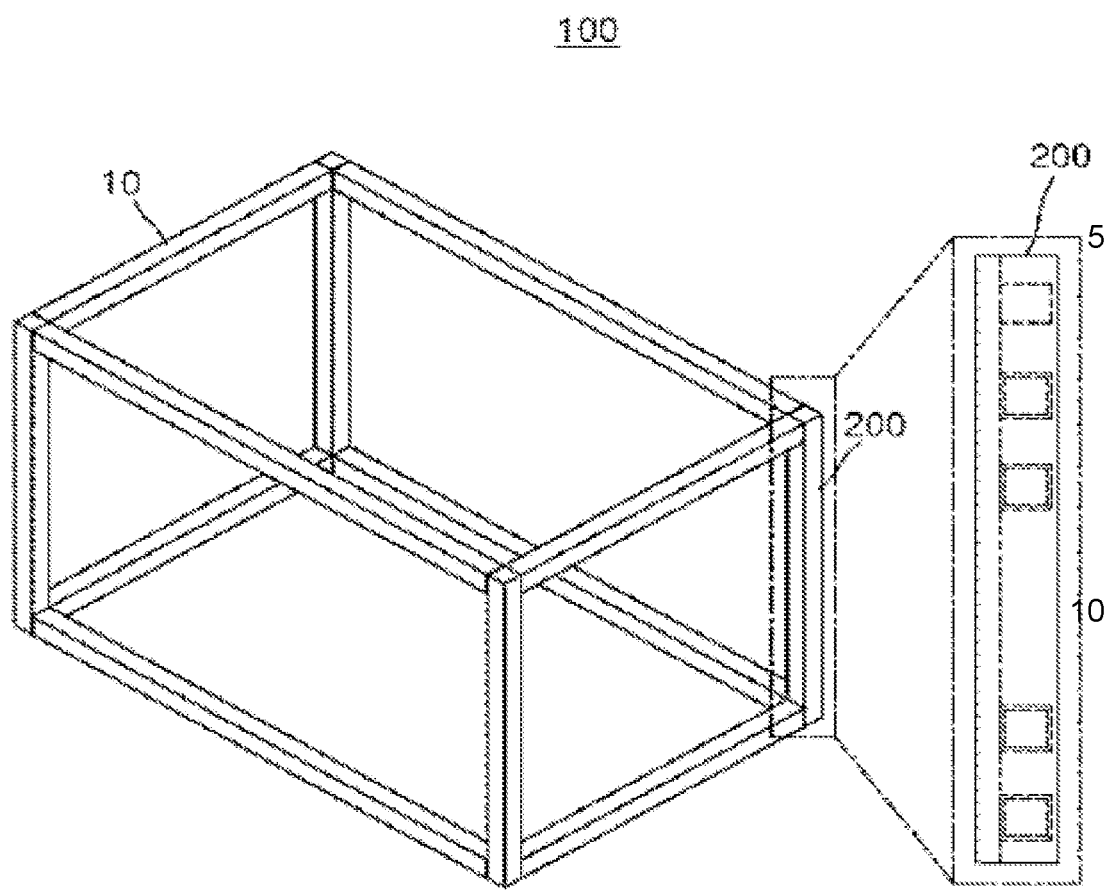
FIGS. 1 to 2 are schematic perspective views of a prefabricated modular unit and a modular unit assembly according to an embodiment of the present invention.

Hereinafter, embodiments of the present invention will be described in detail with reference to the accompanying drawing. In adding reference numerals to components of each drawing, it should be noted that identical or equivalent components are designated by an identical numeral even when they are displayed on other drawings. Further, in describing the embodiment of the present invention, a detailed description of the related known configuration or function will be omitted when it is determined that it interferes with the understanding of the embodiment of the present invention.

In describing the components of the embodiment according to the present invention, terms such as first, second, A, B, (a), (b), and the like may be used. These terms are merely intended to distinguish one component from other components, and the terms do not limit the nature, order, or sequence of the components. Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In a prefabricated modular unit assembly according to the present invention, beyond physical coupling of a plurality of modular units, data information (materials, components, prices, states, and the like) is transmitted and received between the plurality of modular units, the information may be monitored and controlled in real-time, and thus maintenance of architectural modular units may be easily performed.

Figure 2:
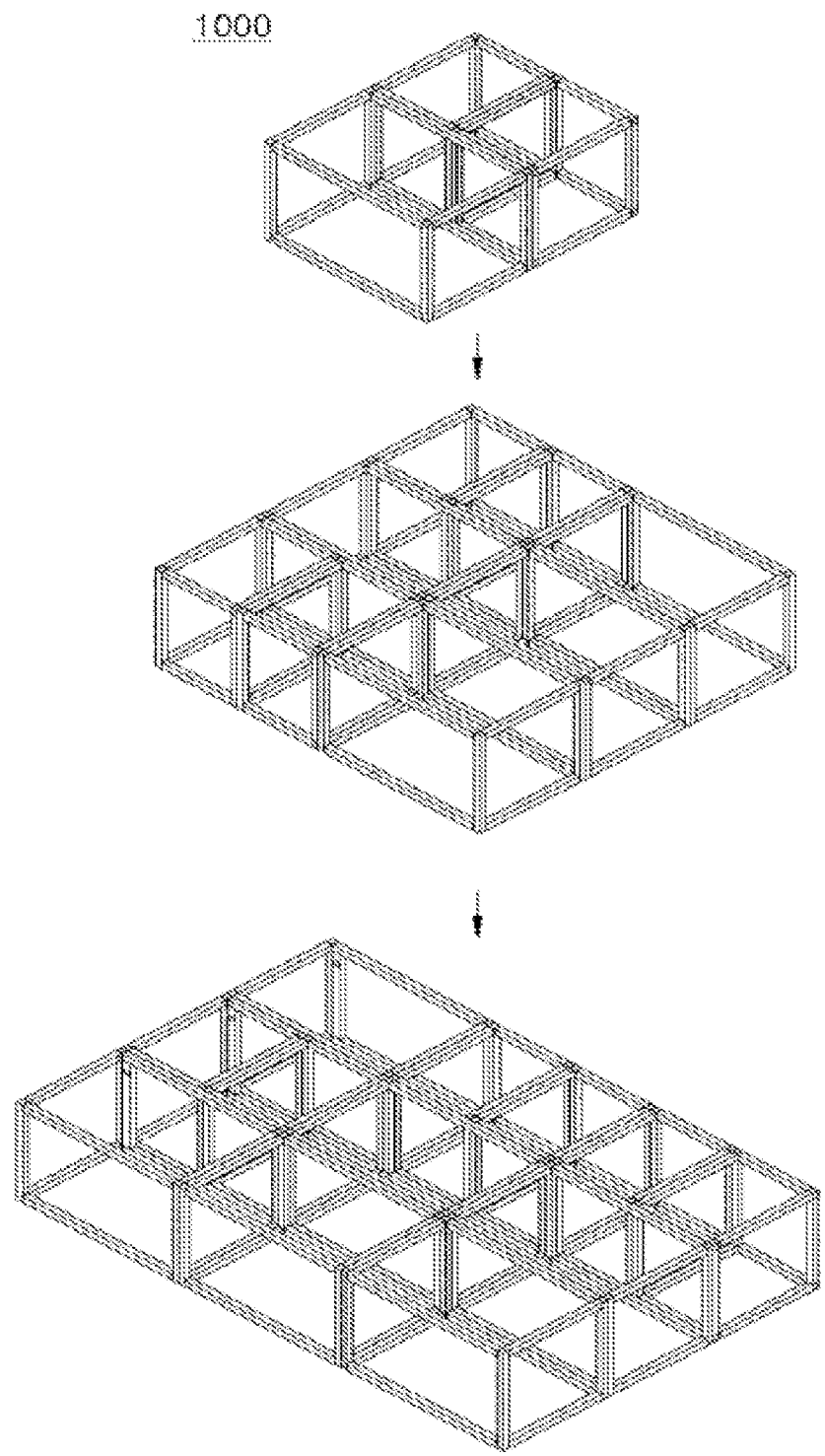
Figure 3:
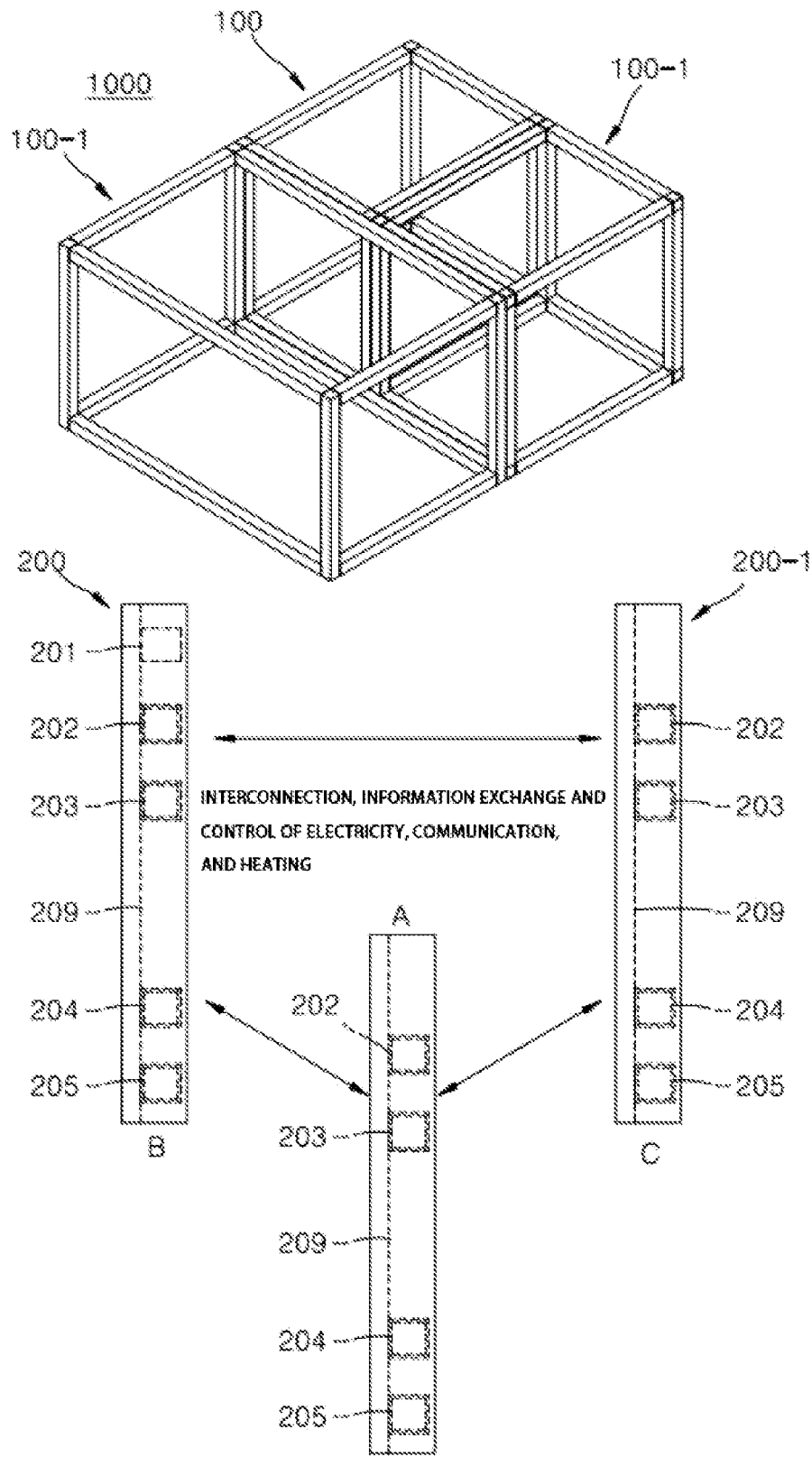
FIGS. 3 and 4 are perspective views of a prefabricated modular unit assembly to which a communication control means is applied according to an embodiment of the present invention.
Figure 4:
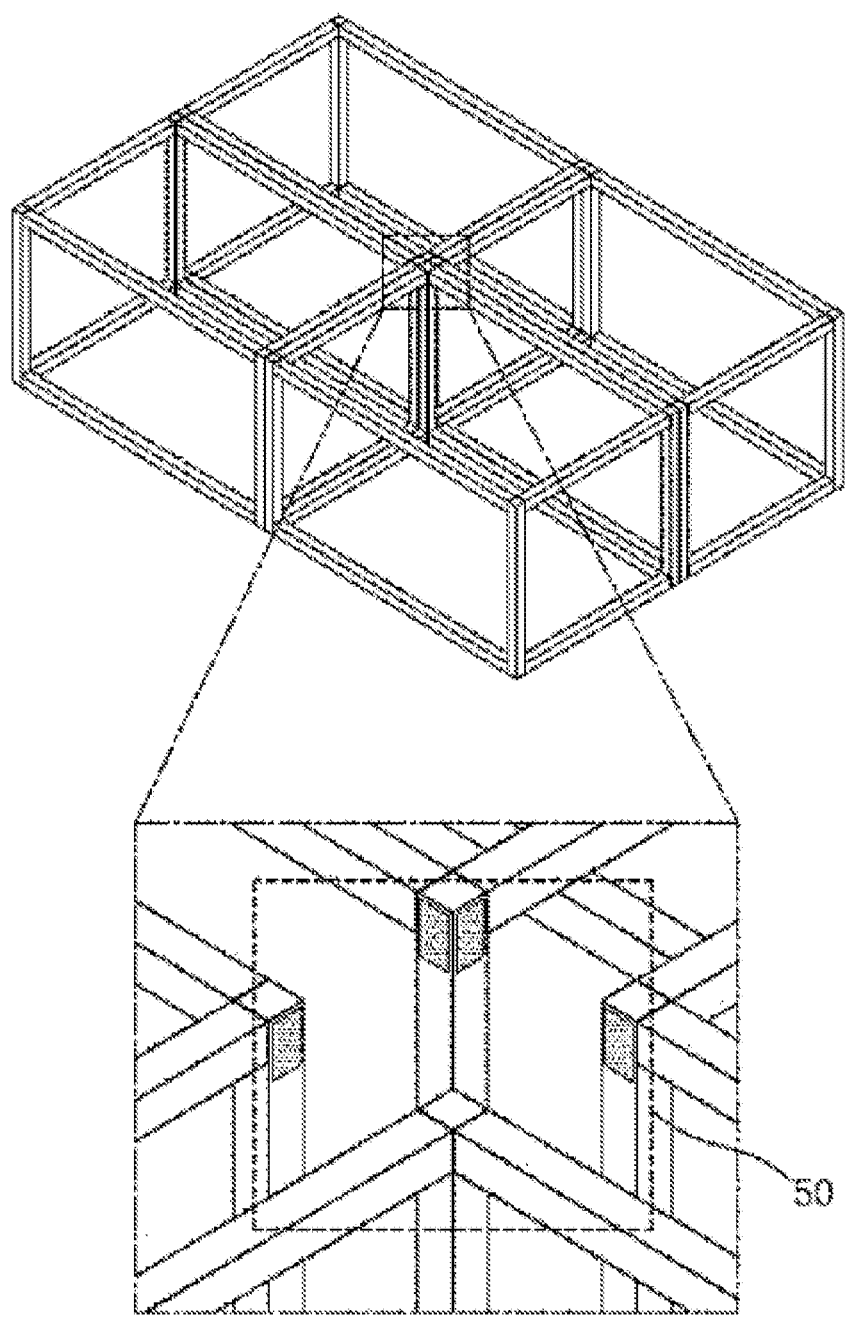
Figure 5:
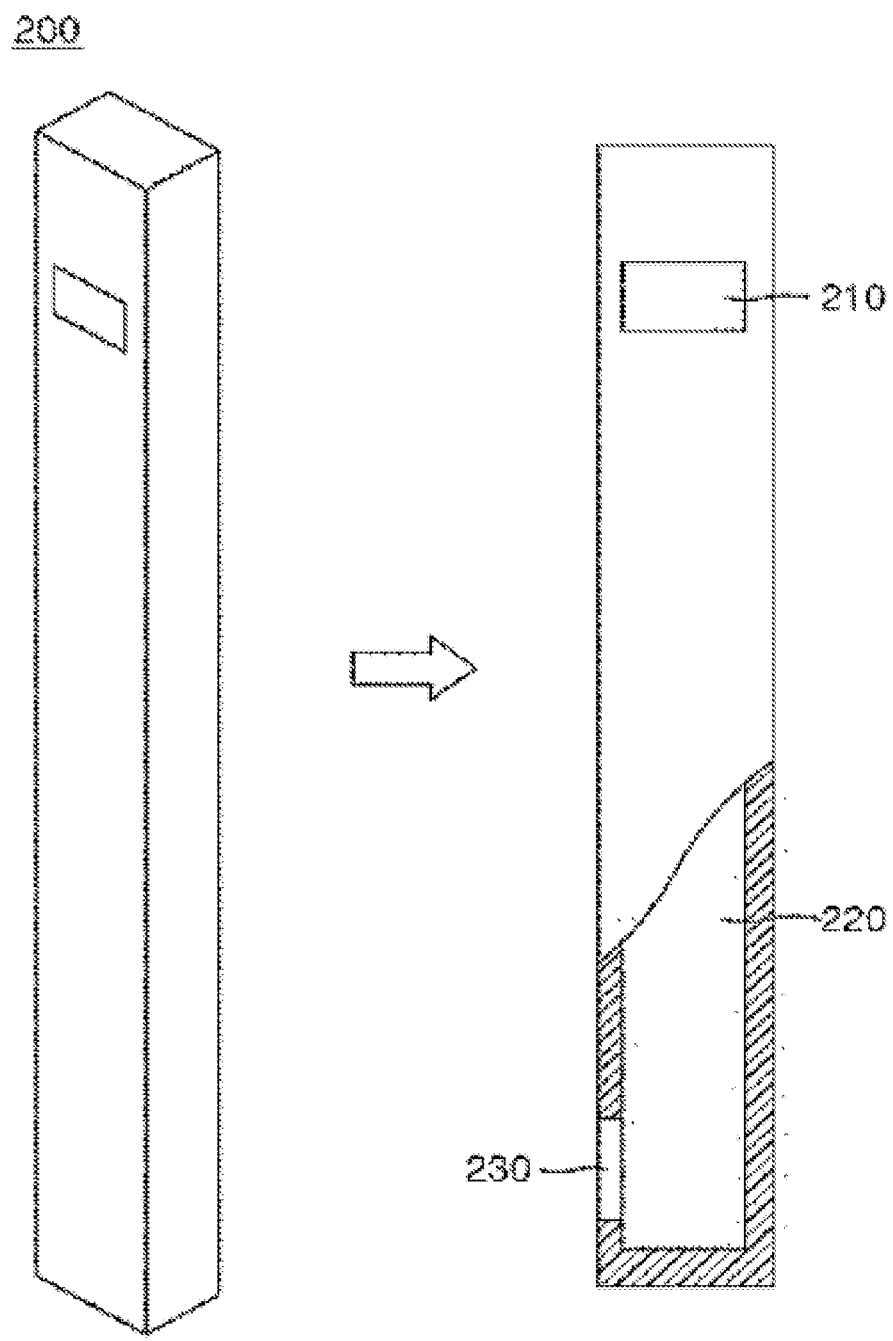
FIGS. 5 to 8 are views illustrating an operation principle of the communication control means of the prefabricated modular unit assembly according to the embodiment of the present invention.
Figure 6:
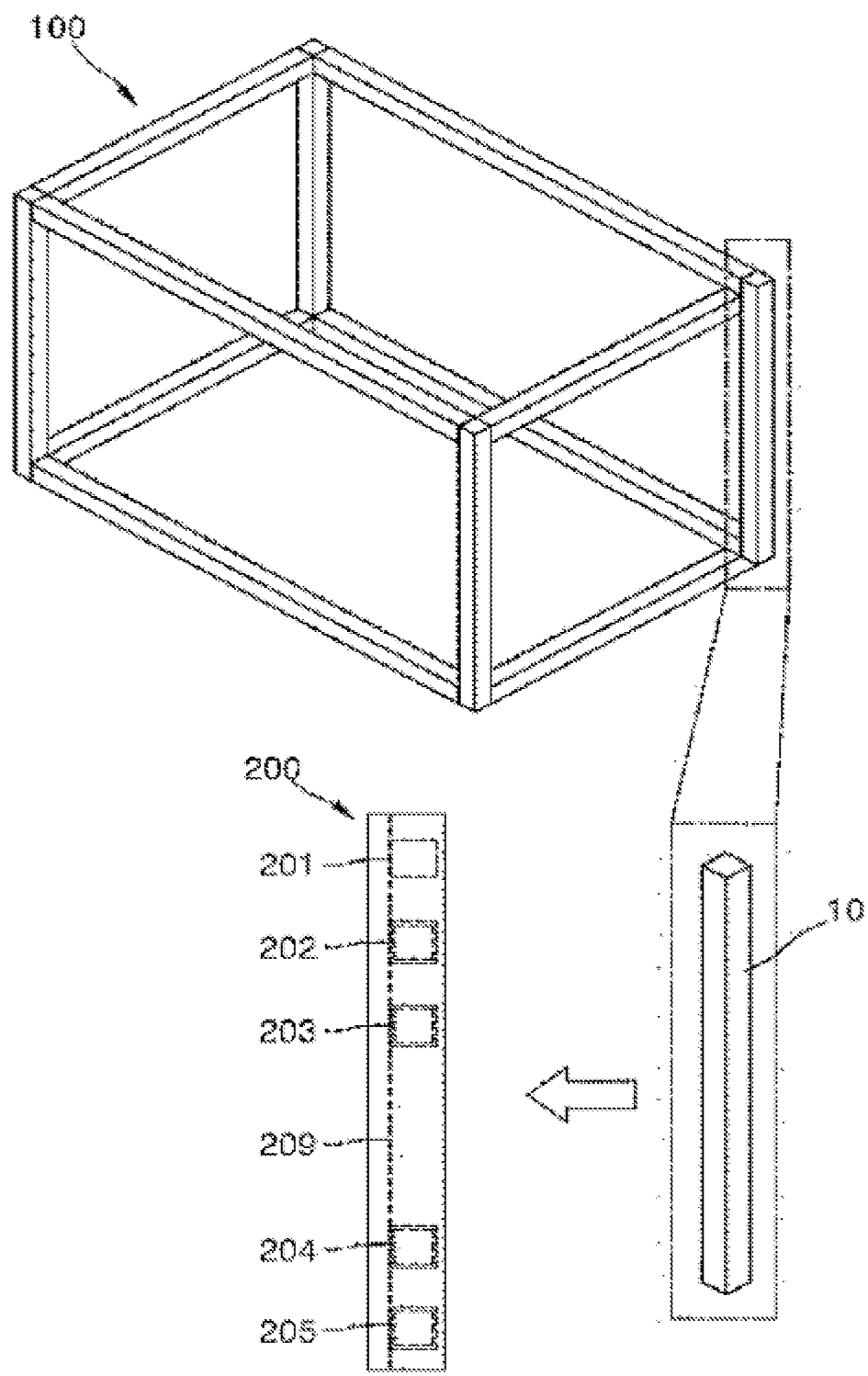
Figure 7A:
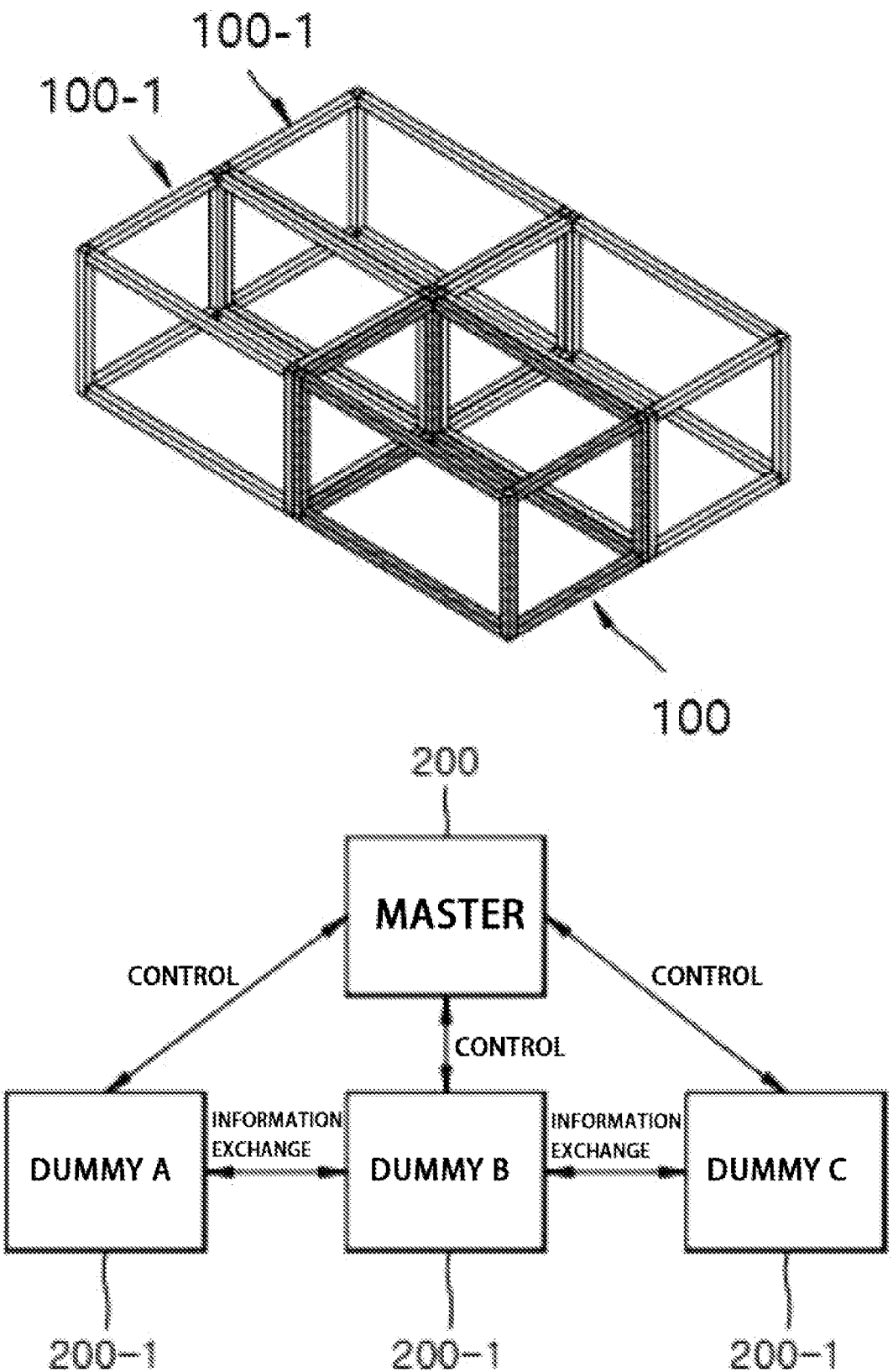
Figure 7B:
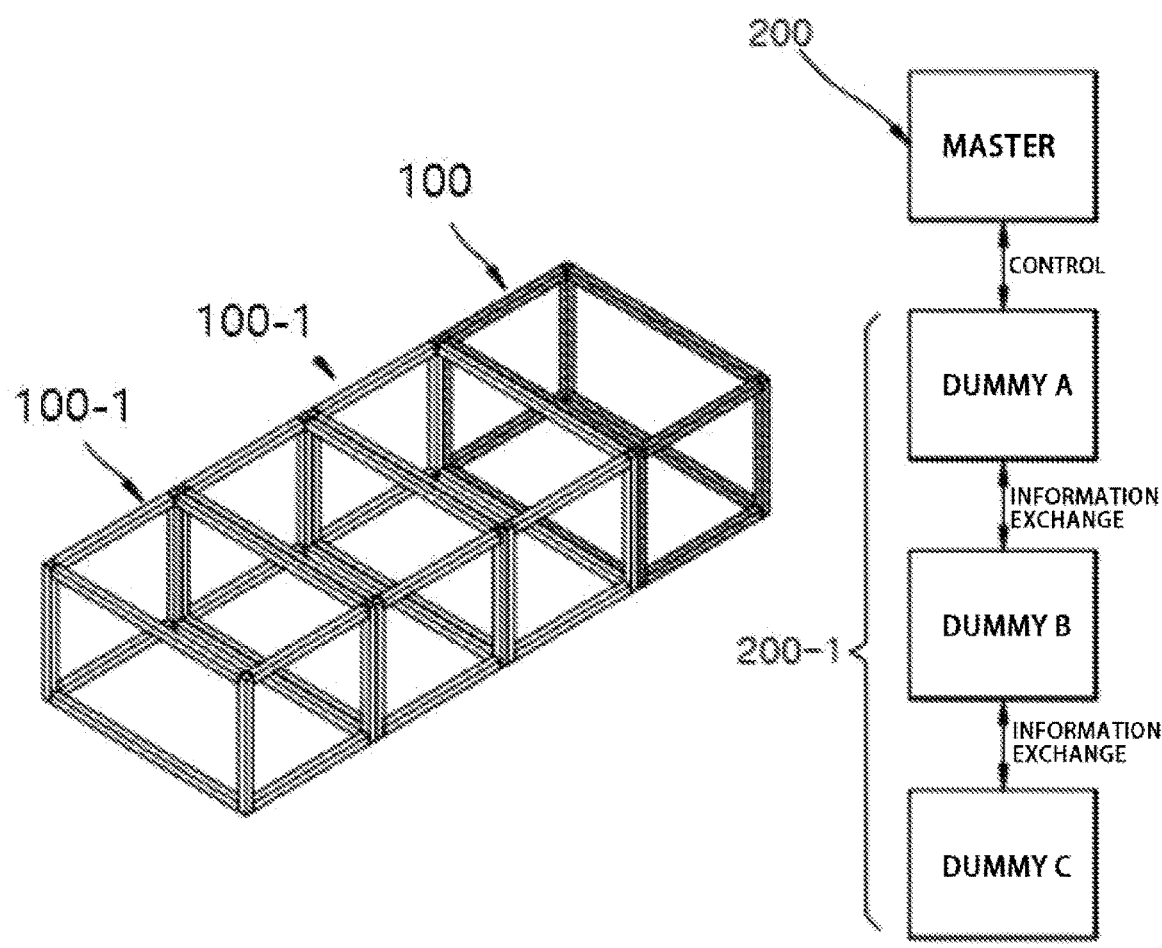
Figure 8:
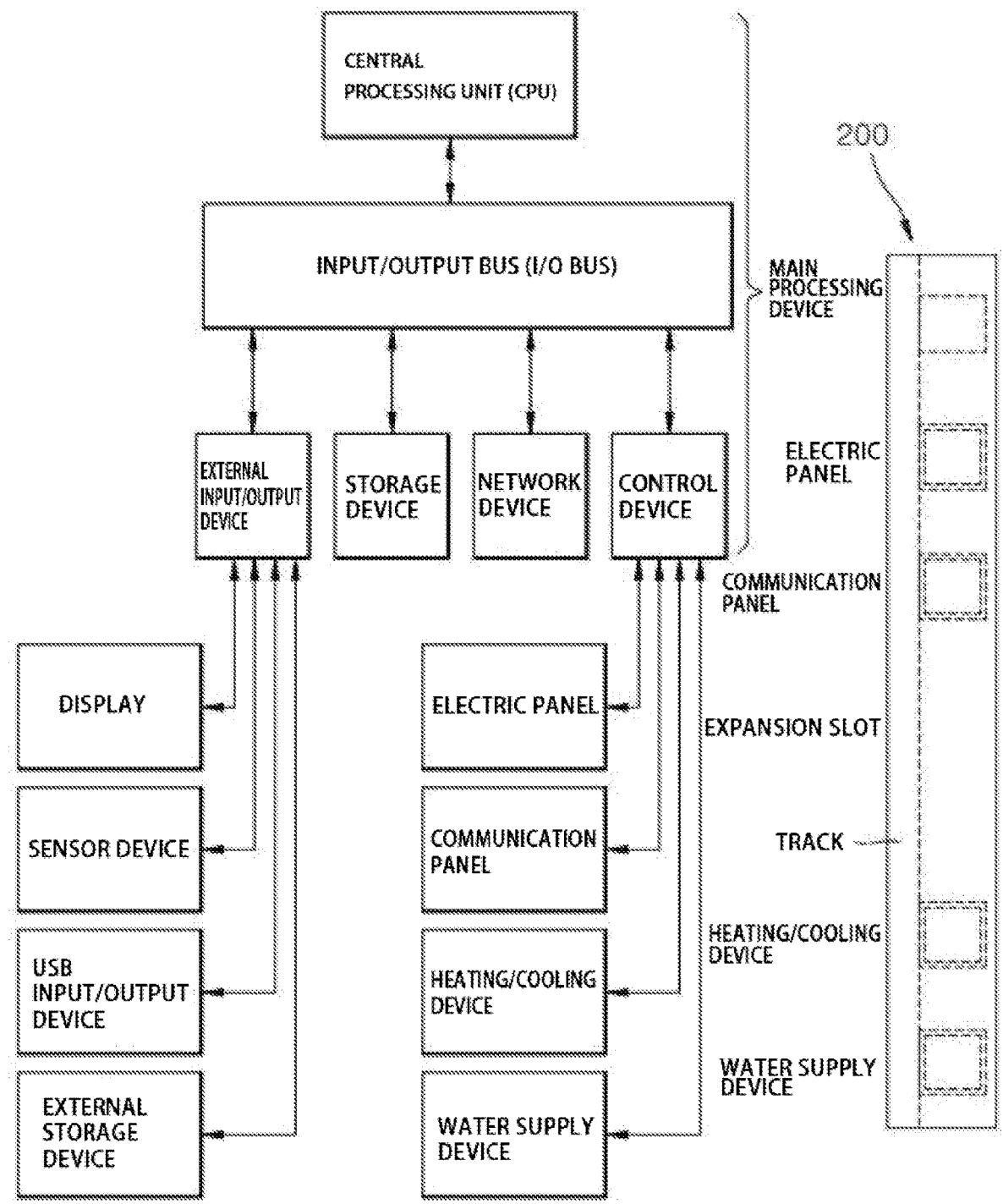

FIGS. 1 to 2 are schematic perspective views of a prefabricated modular unit and a modular unit assembly according to an embodiment of the present invention, and FIGS. 3 and 4 are perspective views of a prefabricated modular unit assembly to which a communication control means is applied according to an embodiment of the present invention.

Referring to these drawings, a prefabricated modular unit assembly 1000 according to the present invention, which is a structure in which modular units 100 and 100-1 completed by assembling a plurality of frames 10 are stacked in a longitudinal direction and a transverse direction, includes the first modular unit 100 to which a main communication control means 200 capable of controlling the plurality of modular units 100 and 100-1 by transmitting and receiving data through mutual wired and wireless communication is coupled, and the second modular unit 100-1 to which an auxiliary communication control means 200-1 for transmitting and receiving data to and from the main communication control means 200 of the first modular unit 100 is coupled. Here, as illustrated in FIG. 4, a short-range wireless communication unit 50 using Wi-Fi, Bluetooth, near field communication (NFC), radio frequency identification (RFID), or the like may be exposed to the outside at one end of a contact surface between the plurality of modular units 100 and 100-1.

The main communication control means 200 is embedded inside one of the plurality of frames 10. The frame 10 may be formed in a reinforced angular pipe, and may serve as a pillar and a beam by itself. The main communication control means 200 is disposed in a longitudinal direction of the frame 10 and connected to communicate through mutual wired and wireless communication with the auxiliary communication control means 200-1 disposed adjacent to the main communication control means 200 at a predetermined distance. Thus, the first modular unit 100 on which the main communication control means 200 is disposed and the second modular unit 100-1 on which the auxiliary communication control means 200-1 is disposed may be controlled through mutual transmitting and receiving communication.

A detailed structure of the main communication control means 200 and the auxiliary communication control means 200-1 will be described in more detail below.

Figure 9:
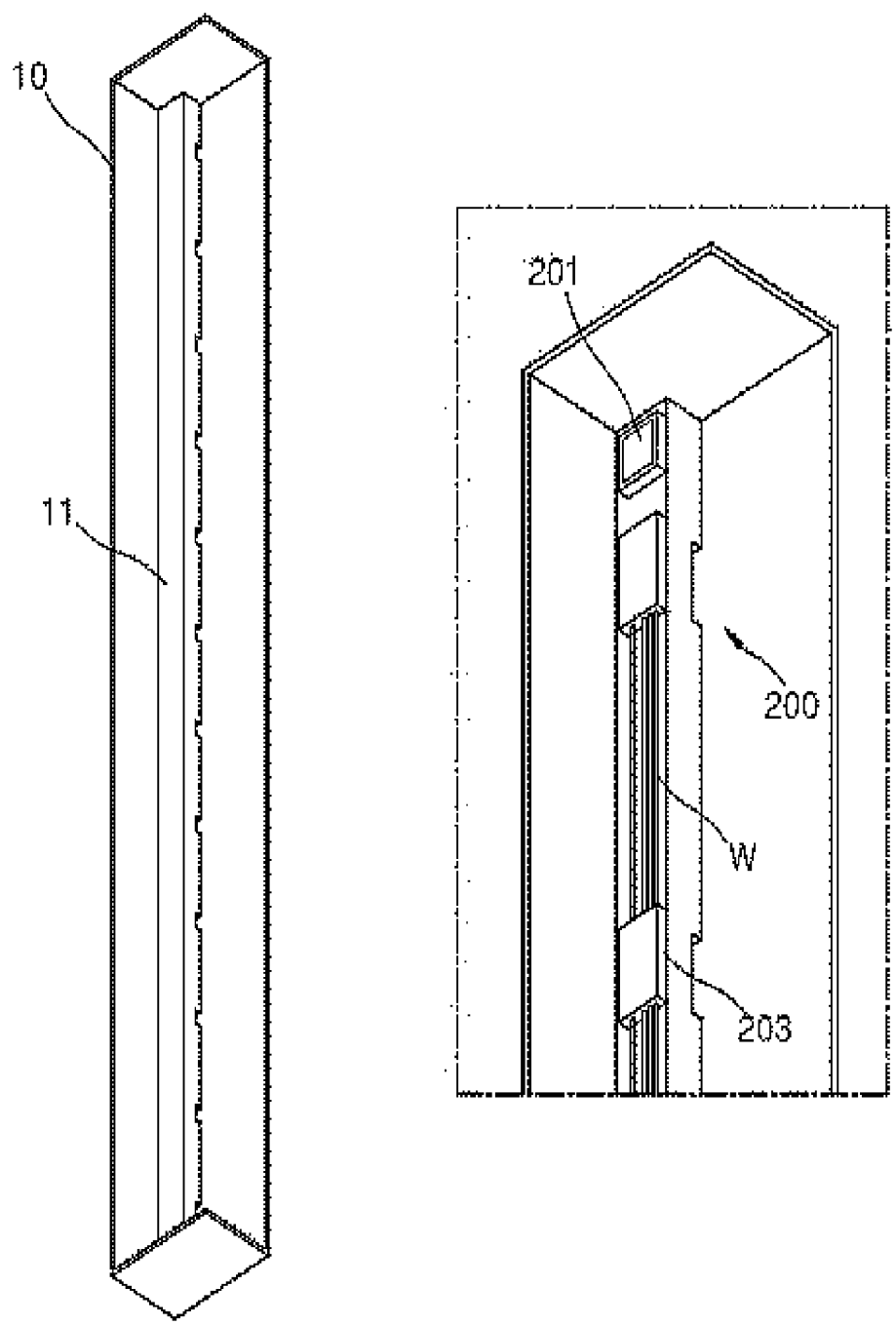
FIGS. 9 and 10 are views illustrating a state in which the communication control means of the prefabricated modular unit assembly is installed according to the embodiment of the present invention.
Figure 10:
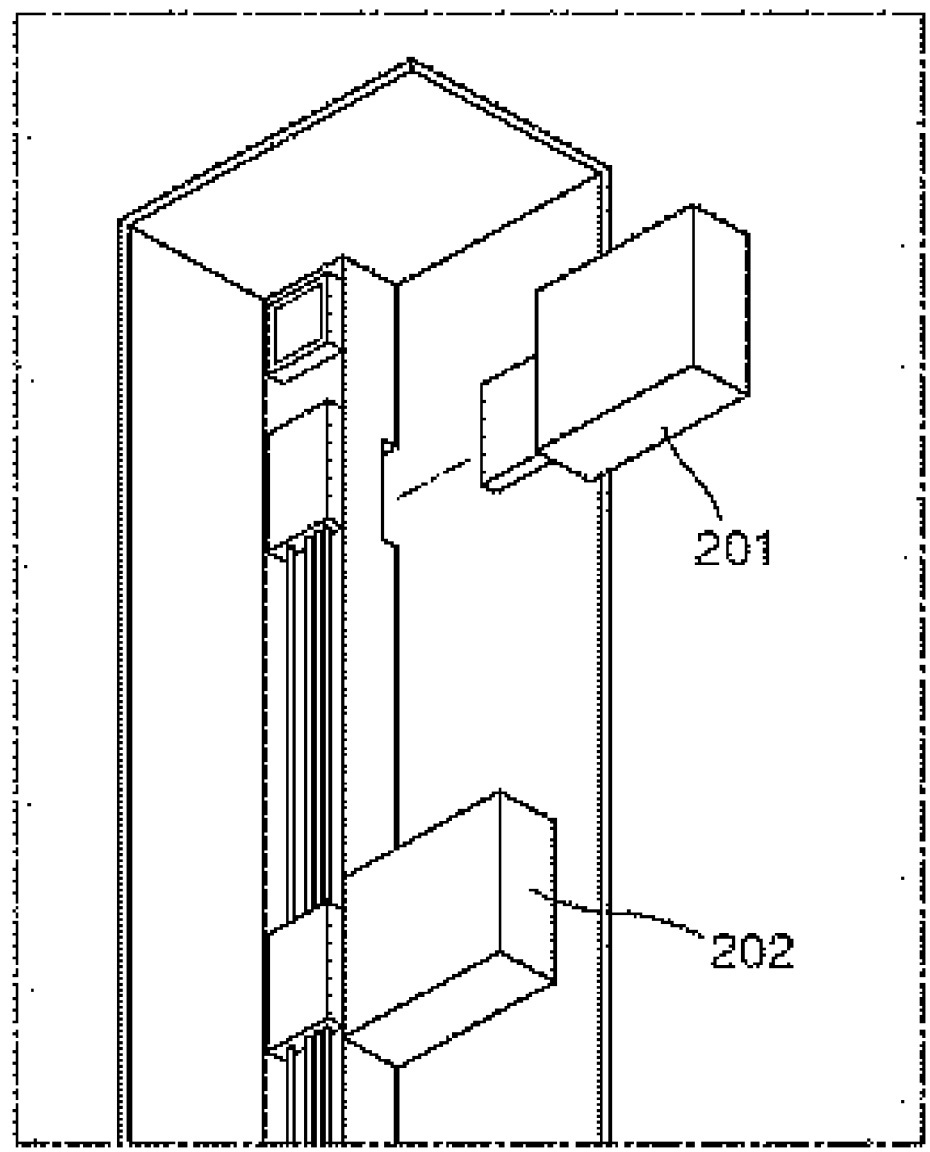

FIGS. 5 to 8 are views illustrating an operation principle of the communication control means of the prefabricated modular unit assembly according to the embodiment of the present invention, and FIGS. 9 and 10 are views illustrating a state in which the communication control means of the prefabricated modular unit assembly is installed according to the embodiment of the present invention.

Referring to these drawings, in the prefabricated modular unit assembly 1000 according to the present invention, the modular units 100 and 100-1 completed by assembling the plurality of frames 10 are stacked in the longitudinal direction and the transverse direction. The main communication control means 200 is formed in the first modular unit 100, and the auxiliary communication control means 200-1 is formed in the second modular unit 100-1.

The main communication control means 200 of the first modular unit 100 differs from the auxiliary communication control means 200-1 of the second modular unit 100-1 in that the former includes a central processing unit 220. However, in some cases, it is obvious that the central processing unit 220 may be formed in the auxiliary communication control means 200-1.

Here, the main communication control means 200 of the first modular unit 100 and the auxiliary communication control means 200-1 of the second modular unit 100-1 includes a controller C, a terminal member 11 which is disposed on one side of the modular units 100 and 100-1 and in which a plurality of slots S are formed at predetermined intervals, and a plurality of panels 202, 203, 204, and 205 mounted on the slots S of the terminal member 11. A communication device, an electric device, a heating/cooling device, and a water supply device provided from the plurality of panels 202, 203, 204, and 205 may be controlled simultaneously or selectively through the controller C.

The main communication control means 200 of the first modular unit 100 and the auxiliary communication control means 200-1 of the second modular unit 100-1 include a display unit 210 to identify current states of respective components from the outside, the central processing unit 220 to independently control the components, and a connection means 230 electrically connected through an electric wire W.

Thus, the plurality of modular units 100 and 100-1 disposed adjacent to each other and connected consecutively may each include an independent space and may mutually transmit and receive information to be controlled and displayed in a state in which the panels 202, 203, 204, and 205 connected to the communication device, the electric device, the heating/cooling device, and the water supply device are connected in an interior thereof.

In detail, the main communication control means 200 according to the present invention may be disposed in the longitudinal direction inside one of the plurality of frames 10 constituting the first modular unit 100. The main communication control means 200 may identify information of the adjacent auxiliary communication control means 200-1, that is, information of the communication device, the electric device, the heating/cooling device, and the water supply device in real-time, and may transmit and receive the data information.

The terminal member 11 is disposed on the frame 10 in the main communication control means 200 of the first modular unit 100. Slots S formed at predetermined intervals are formed in the terminal member 11, and a main processing device 201, the electric device control panel 202, the communication device control panel 203, the heating/cooling device control panel 204, and the water supply device control panel 205 are independently coupled to the slots S. If necessary, a plurality of additional expansion slots 209 may be formed.

These panels are formed in the form of a module box and are independently coupled to the slots S formed in the terminal member 11 in a plug-in manner.

In the auxiliary communication control means 200-1 of the second modular unit 100-1, the terminal member 11 is disposed on the frame 10, and the slots S formed at predetermined intervals are formed in the terminal member 11. Likewise, the main processing device 201, the electric device control panel 202, the communication device control panel 203, the heating/cooling device control panel 204, and the water supply device control panel 205 are independently coupled to the slots S. If necessary, a plurality of additional expansion slots 209 may be formed. These panels are formed in the form of a module box and are independently coupled to the slots S formed in the terminal member 11 in a plug-in manner.

As described above, the main processing device 201 may not be formed in the auxiliary communication control means 200-1. However, even in this case, a communication unit (not illustrated) may be formed to enable transmission and reception with the controller C.

According to the present invention, in the prefabricated modular unit assembly 1000, states of the electric device, the communication panel, the heating/cooling device, the water supply device and the like, which are essential components of a building connected to the plurality of modular units 100 and 100-1, may be monitored and controlled in real time, and thus parts that require repair or replacement can be replaced immediately.

Furthermore, although not illustrated in the drawings presented by the present invention, when the parts requiring repair or replacement among the components are detected, a specific item can be checked through a model number of the corresponding component, and the item can be ordered on-line through the controller and the communication unit.

Hereinabove, embodiments of the present invention have been described in detail with reference to the accompanying drawings. However, embodiments of the present invention are not necessarily limited to the above-described embodiment, and it is obvious that various modifications and equivalent implementations may be made by those skilled in the art to which the present invention pertains. Therefore, the true scope of rights of the present invention will be determined by the appended claims.

The invention claimed is:

1. A prefabricated modular unit assembly that is a structure in which a plurality of modular units completed using a plurality of frames are assembled, the prefabricated modular unit assembly comprising:
   a first modular unit (100) including a main communication control means (200) that is embedded inside one frame of the plurality of frames, wherein the main communication control means is controlled by transmitting and receiving data through mutual wired/wireless communication between the modular units; and
   a second modular unit (100-1) including an auxiliary communication control means (200-1) embedded inside one frame of the plurality of frames, wherein the auxiliary communication control means is configured to transmit and receive data to and from the main communication control means of the first modular unit,
   wherein the prefabricated modular unit assembly (1000) is configured to monitor and control states of an electric device, a communication panel, a heating and cooling device, a water supply device, which are required for a building connected to the first modular unit (100) and the second modular unit (100-1),
   wherein the first modular unit and the second modular unit are completed by the plurality of frames, each of which including an independent space,
   wherein the main communication control means or the auxiliary communication control means includes:
   a controller;
   a terminal member which is disposed on one side of the modular unit and in which
   a plurality of slots are formed at predetermined intervals; and
   a plurality of panels mounted on the slots of the terminal member,
   wherein the terminal member is disposed on each frame in the main communication control means, the slots formed at predetermined intervals are formed in the terminal member, and an electric device control panel, a communication device control panel, a heating and cooling device control panel, and a water supply device control panel are independently coupled to the slots as the plurality of panels,
   wherein the terminal member is disposed on each frame in the auxiliary communication control means, the slots formed at predetermined intervals are formed in the terminal member, and an electric device control panel, a communication device control panel, a heating and cooling device control panel, and a water supply device control panel are independently coupled to the slots as the plurality of panels, and
   wherein the plurality of panels are formed in the form of a module box and are independently coupled to the slots formed in the terminal member in a plug-in manner,
   wherein the controller has a function of controlling at least one of communication, electricity, heating/cooling, or water supply provided from the panels, and
   wherein the main communication control means is equipped with a central processing unit (CPU) such that data information on materials, components or prices is transmitted and received between the modular units and the modular units are monitored and controlled in real-time for maintenance.

2. The prefabricated modular unit assembly of claim 1, wherein a display unit that is externally visible is formed in the main communication control means or the auxiliary communication control means.

3. The prefabricated modular unit assembly of claim 1, wherein a short-range wireless communication unit for mutual wireless communication is formed on a frame of a modular unit adjacent to and facing a frame of the modular unit.

* * * * *